(12) United States Patent
Lee et al.

(10) Patent No.: US 7,473,661 B2
(45) Date of Patent: Jan. 6, 2009

(54) METHOD FOR PREPARING A SINTERED BODY OF ALUMINUM NITRIDE

(75) Inventors: Min-Woo Lee, Pyeongtaek-si (KR); Hyung Suk Ahn, Seoul (KR); Sung-Min Lee, Seoul (KR)

(73) Assignee: Komico Ltd. (KR)

( * ) Notice: Subject to any disclaimer, the term of this patent is extended or adjusted under 35 U.S.C. 154(b) by 0 days.

(21) Appl. No.: 12/016,694

(22) Filed: Jan. 18, 2008

(65) Prior Publication Data
US 2008/0111097 A1      May 15, 2008

Related U.S. Application Data

(62) Division of application No. 11/405,243, filed on Apr. 17, 2006, now Pat. No. 7,375,045.

(30) Foreign Application Priority Data
Apr. 22, 2005   (KR) .................. 10-2005-0033734

(51) Int. Cl.
  *C04B 35/581* (2006.01)
(52) U.S. Cl. .................... 501/98.5; 501/98.4
(58) Field of Classification Search ............... 501/98.5, 501/98.4
See application file for complete search history.

(56) References Cited

U.S. PATENT DOCUMENTS

| | | | | |
|---|---|---|---|---|
| 5,457,075 A | * | 10/1995 | Fukushima et al. | 501/96.4 |
| 2006/0213900 A1 | * | 9/2006 | Matsuda et al. | 219/444.1 |
| 2006/0217259 A1 | * | 9/2006 | Teratani et al. | 501/98.5 |

FOREIGN PATENT DOCUMENTS

JP      2002220282      * 9/2002

\* cited by examiner

*Primary Examiner*—Karl E Group
(74) *Attorney, Agent, or Firm*—Cantor Colburn LLP

(57) ABSTRACT

Disclosed is a method for preparing a high dense aluminum nitride (AlN) sintered body. The method includes the steps of preparing powders for the AlN sintered body comprising $Y_2O_3$ of 0.1 to 15 wt %, $TiO_2$ of 0.01 to 5 wt % and MgO of 0.1 to 10 wt %, and obtaining the AlN sintered body with a volume resistivity of $1\times10^{15}$ Ωcm or more at a normal temperature and a relative density of 99% or more. The sintered body is obtained by sintering the powders and then cooling the sintered powders or sintering the powders and then cooling the sintered powders with annealing the sintered powders during the cooling.

5 Claims, 2 Drawing Sheets

METHOD FOR PREPARING A SINTERED BODY OF ALUMINUM NITRIDE

This application is a divisional of U.S. patent application Ser. No. 11/405,243, filed Apr. 17, 2006, now U.S. Pat. No. 7,375,045.

BACKGROUND OF THE INVENTION

1. Field of the Invention

The present invention relates to a high dense sintered body of aluminum nitride, a method for preparing the same and a member for manufacturing semiconductor using the sintered body.

2. Description of the Prior Art

Materials mainly composed of aluminum nitride (AlN) have good thermal conductivity and insulating property so that they have been usually used for electrostatic chucks fixing wafers during semiconductor manufacturing process or for heaters which heat wafers during fixing in CVD process and the like.

The electrostatic chucks fix wafers using an electrostatic force and can be classified to a Johnsen-Rahbek type and a coulomb type according to their adsorbing way.

The Johnsen-Rahbek type electrostatic chuck generally has low volume resistivity of about $1 \times 10^9 \sim 1 \times 10^{12}$ Ωcm so that electric charges come to be charged on a dielectric adsorptive surface for wafer due to such low volume resistivity. The electrostatic attraction between the electric charges of the surface makes the wafer to be fixed.

Since the conventional AlN materials have low volume resistivity as well as low relative density, they were mainly used for the Johnsen-Rahbek type electrostatic chucks having low volume resistivity.

The Johnsen-Rahbek type electrostatic chucks, however, have problem that the leakage current thereof is large and a wafer is hardly detached from the electrostatic chucks due to the remained electric charges on the surface of the electrostatic chucks even after interrupting the application of direct voltage.

Meanwhile, the coulomb type electrostatic chucks fix wafers using an electrostatic attraction between the differently charged particles present on the upper/lower surfaces of a dielectric. Said coulomb type electrostatic chucks show low leakage current and good detachment property at the volume resistivity of $1 \times 10^{15}$ Ωcm or more.

Therefore, aluminum nitride materials which can be applied to even a member for manufacturing semiconductor requiring high volume resistivity like the coulomb type electrostatic chucks as well as the Johnsen-Rahbek type electrostatic chucks have been needed.

SUMMARY OF THE INVENTION

Accordingly, the present invention is for solving the above-mentioned problems occurring in the prior art, and an object of the present invention is to provide a high dense aluminum nitride sintered body, a preparing method thereof and a member for manufacturing semiconductor using the sintered body, which shows excellent leakage current characteristic, enough adsorption property, good detachment property and excellent thermal conductivity and so can be applied to even a member for manufacturing semiconductor requiring high volume resistivity like the coulomb type electrostatic chucks as well as the Johnsen-Rahbek type electrostatic chucks.

In order to accomplish the above object, there is provided a high dense aluminum nitride (AlN) sintered body, wherein a ratio of diffraction peak intensity of titanium nitride (TiN) to that of AlN is 0.1 to 20%, a ratio of diffraction peak intensity of magnesium aluminate ($MgAl_2O_4$) to that of AlN is 0.1 to 10%, a volume resistivity thereof is $1 \times 10^{15}$ Ωcm or more at a normal temperature and a relative density thereof is 99% or more.

In the present invention, it is preferable that the ratio of diffraction peak intensity of TiN to that of AlN is 0.5 to 5%.

In the present invention, it is preferable that the ratio of diffraction peak intensity of $MgAl_2O_4$ to that of AlN is 0.5 to 5%.

In order to accomplish the above object, there is provided a high dense aluminum nitride (AlN) sintered body, wherein powders for the AlN sintered body comprise $Y_2O_3$ of 0.1 to 15 wt %, $TiO_2$ of 0.01 to 5 wt % and MgO of 0.1 to 10 wt % and the AlN sintered body has a volume resistivity of $1 \times 10^{15}$ Ωcm or more at a normal temperature and a relative density of 99% or more.

In the present invention, it is preferable that the powders comprise $Y_2O_3$ of 1 to 9 wt %, $TiO_2$ of 0.05 to 0.5 wt % and MgO of 0.5 to 5 wt %.

In order to accomplish the above object, there is provided a member for manufacturing semiconductor, which is composed of said high dense aluminum nitride (AlN) sintered body.

In the present invention, it is preferable that the member is a coulomb type electrostatic chuck.

In order to accomplish the above object, there is provided a method for preparing a high dense aluminum nitride (AlN) sintered body comprising the steps of: preparing powders for the AlN sintered body comprising $Y_2O_3$ of 0.1 to 15 wt %, $TiO_2$ of 0.01 to 5 wt % and MgO of 0.1 to 10 wt % (S1); and obtaining the AlN sintered body with a volume resistivity of $1 \times 10^{15}$ Ωcm or more at a normal temperature and a relative density of 99% or more by sintering the powders and then cooling the sintered or sintering the powders and then cooling the sintered with annealing the sintered during the cooling (S2).

In the present invention, it is preferable that in the step S1, the powders comprise $Y_2O_3$ of 1 to 9 wt % and/or $TiO_2$ of 0.05 to 0.5 wt % and/or MgO of 0.5 to 5 wt %.

In the present invention, it is preferable that in the step S2, the sintering temperature is 1700 to 1850° C., more preferable 1750 to 1800° C.

In the present invention, it is preferable that in the step S2, the sintering time is 1 to 10 hours, more preferable 3 to 5 hours.

In the present invention, it is preferable that in the step S2, the annealing temperature is 1400 to 1650° C., more preferable 1450 to 1550° C.

In the present invention, it is preferable that in the step S2, the annealing time is 1 to 5 hours, more preferable 2 to 3 hours.

DETAILED DESCRIPTION OF THE PREFERRED EMBODIMENTS

Figure 1:
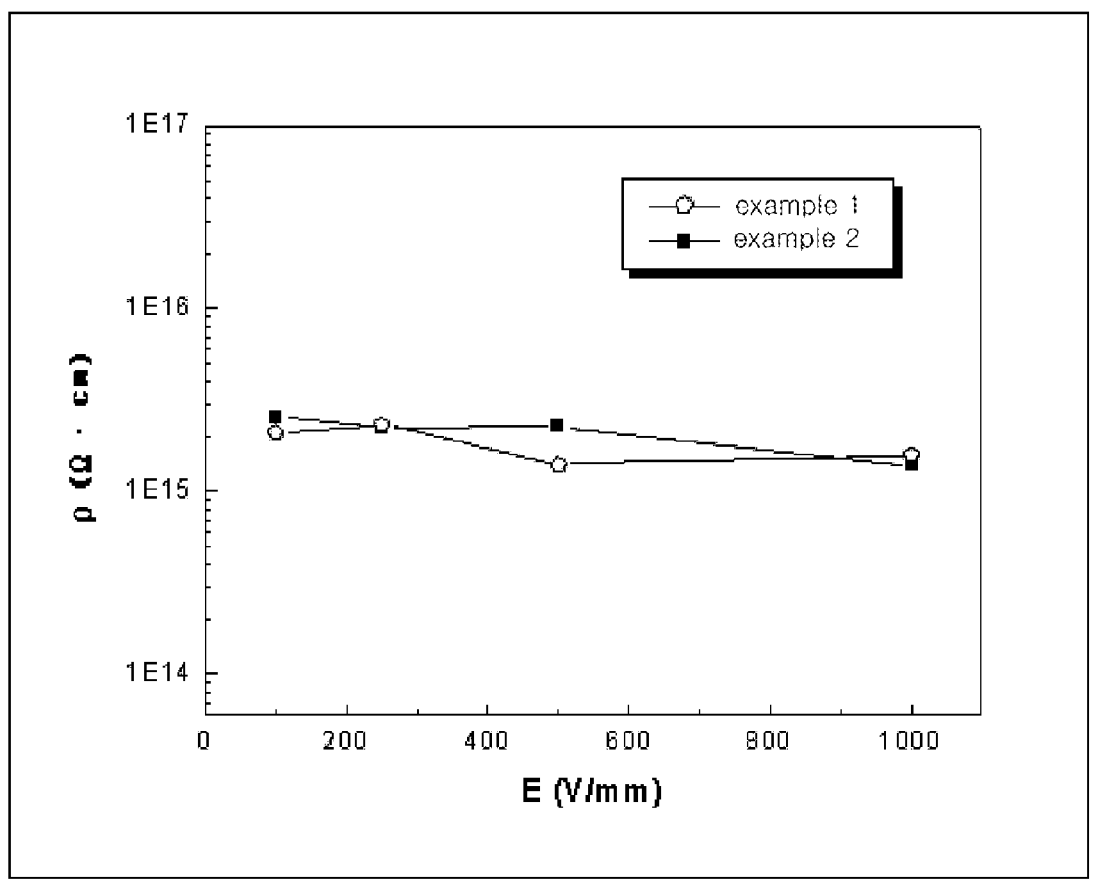
FIG. 1 is a graph showing a variation of volume resistivity according to a variation of electric field applied to an aluminum nitride (AlN) sintered body in the first and second examples of the present invention.

Hereinafter, a high dense aluminum nitride (AlN) sintered body, a preparing method thereof, and a member for manufacturing semiconductor using the sintered body according to the present invention will be described in detail.

In the present invention, the high dense AlN sintered body which is applicable to a member for manufacturing semiconductor in particular such as a coulomb type electrostatic chuck is prepared. The AlN sintered body of the invention has a volume resistivity of $1\times10^{15}$ Ωcm or more at a normal temperature and a relative density of 99% or more, wherein the AlN sintered body comprises yttrium aluminate, titanium nitride and magnesium aluminate which is spinet, and a ratio of diffraction peak intensity of titanium nitride (TiN) to that of AlN is 0.1 to 20%, preferably 0.5 to 5 wt % and a ratio of diffraction peak intensity of magnesium aluminate ($MgAl_2O_4$) to that of AlN is 0.1 to 10%, preferably 0.5 to 5 wt %.

The high dense AlN sintered body is prepared as follows:

First, $Y_2O_3$ powders, $TiO_2$ powders and MgO powders are prepared so as to the total weight of powders before sintering can contain $Y_2O_3$ Of 0.1 to 15 wt %, $TiO_2$ of 0.01 to 5 wt % and MgO, which is an oxide forming spinel with aluminum oxide ($Al_2O_3$), of 0.1 to 10 wt %. Then, they are mixed in a solvent together with AlN powders to be dried and pulverized (S1).

If the yttrium oxide is contained below 0.1 wt %, a relative density of AlN sintered body comes to be reduced, and if over 15 wt %, a thermal conductivity of the AlN sintered body comes to be reduced.

If the titanium oxide is contained below 0.01 wt % or over 5 wt %, a volume resistivity of the AlN sintered body comes to be reduced. In addition, if the magnesium oxide is contained below 0.1 wt % or over 10 wt %, a volume resistivity of the AlN sintered body comes to be reduced.

In order to obtain an AlN sintered body with a volume resistivity of $1\times10^{15}$ Ωcm or more at a normal temperature and a relative density of 99% or more, instead of the magnesium oxide, a beryllium oxide (BeO), a calcium oxide (CaO), a strontium oxide (SrO), a barium oxide (BaO), a cobalt oxide (CoO), a nickel oxide (NiO) and the like can be used in the present invention.

Meanwhile, in order to obtain a higher volume resistivity and relative density, it is preferable to especially use the yttrium oxide of 1 to 9 wt %, the titanium oxide of 0.05 to 0.5 wt % and magnesium oxide of 0.5 to 5 wt %.

Next, the powers for the AlN sintered body prepared in the step S1 are sintered and then cooled, or sintered and then cooled with being annealed while being cooled. To this end, a high dense AlN sintered body according to the present invention comes to be obtained (S2).

The sintering temperature is preferably 1700 to 1850° C., more preferably 1750 to 1800° C., and the sintering time is preferably 1 to 10 hours, more preferably 3 to 5 hours.

If the sintering temperature is below 1700° C., the relative density comes to be reduced. If the sintering temperature is over 1850° C., economical losses come to be caused. Also, if the sintering time is below 1 hour, the relative density comes to be reduced. If the sintering time is over 10 hours, economical losses come to be caused.

The annealing temperature is preferably 1400 to 1650° C., more preferably 1450 to 1550° C. In addition, the annealing time is preferably 1 to 5 hours, more preferably 2 to 3 hours. The relative density comes to increase slightly within such range of the annealing temperature and time.

If the annealing time is below 1 hour, a physical property after annealing is not changed greatly compared to that before annealing. If the annealing time is over 5 hours, there comes to be no more annealing effect, which means that unnecessary costs can be caused.

The high dense AlN sintered body as prepared above has the volume resistivity of $1\times10^{15}$ Ωcm or more at a normal temperature and the relative density of 99% or more. Further, it has good leakage current characteristic, enough adsorbing property, good detachment property and excellent thermal conductivity and so can be applied to even a member for manufacturing semiconductor requiring high volume resistivity like the coulomb type electrostatic chucks as well as the Johnsen-Rahbek type electrostatic chucks.

Hereinafter, the present invention will be described in more detail by means of the examples of the invention. However, the present invention is not limited to the following examples and various modifications can be realized within the scope of the appended claims. It will be understood that the following examples are provided to disclose the invention completely and to allow those skilled in the art to carry out the invention with ease.

PREPARATION AND EXPERIMENT

Preparation of Source Powders

Reduced nitride powders with high purity were used as AlN powders. AlN powders had a purity of 99.9% or more except oxygen and an average grain diameter of about 1.29 μm.

$Y_2O_3$ powders having an average grain diameter of about 0.8 μm were used. Further, $TiO_2$ powders having an average grain diameter of about 1.1 μm were used. Also, MgO powders having an average grain diameter of about 1.3 μm were used.

Such powders were mixed in the respective compositions of Table 1 showing examples and Table 2 showing comparative examples.

The powders were wet-mixed for 20 hours in a solvent of anhydrous ethanol using a nylon pot and an alumina ball. After mixing, the slurry was extracted and dried at 80° C. in a drier. The dried slurry was pulverized using an alumina mortar. The pulverized powders were sieved by using an 80-mesh sieve to prepare AlN sintered body.

Hot Press Sintering

The AlN sintered powders as prepared above were placed in a graphite mold with a diameter of 40 mm. Then, the AlN sintered powders were sintered at a predetermined sintering temperature as shown in Tables 1 and 2 for some time under the press pressure of 15 Mpa and the nitrogen atmosphere pressure of 0.1 Mpa, and then cooled or annealed while being cooled. While cooling to a normal temperature during hot press sintering, nitrogen gas was flowed in 40 cc/min.

Evaluation of Volume Resistivity

A thickness of a specimen was based on 1 mm. A shape of an electrode was made to have a main electrode with a diameter of 26 mm and a guard electrode with a diameter of 38 mm. In case of examples 1 and 2, the volume resistivities thereof were evaluated under applied voltage of 100, 250, 500 and 1000V/mm and under the time for applying voltage of 60 seconds. In case of the other examples and comparative examples, the volume resistivities thereof were evaluated at the applied voltage of 500V/mm. In order to sufficiently remove residual charges on the surface of the specimen in repeating the evaluation, re-evaluation was performed after the exposure to air for 5 minutes which follows the evaluation.

Measurement of Crystalline Phase

An X-ray diffractometer was used. The measuring condition was CuKα, 40 kV, 30 mA and 2θ=5°~80°.

Evaluation of Relative Density

The relative density was determined through dividing a bulk density evaluated in water with Archimedes' principle by a theoretical density.

EXAMPLES

Table 1 shows source materials, sintering conditions and sintered body characteristics of the examples.

TABLE 1

| Examples | Source material condition | | | | Sintering condition | | | | Sintered body characteristic | |
|---|---|---|---|---|---|---|---|---|---|---|
| | AlN wt % | $Y_2O_3$ wt % | $TiO_2$ wt % | MgO wt % | Sintering temp. °C. | Sintering time Hour | Annealing temp. °C. | Annealing time Hour | Relative density % | Volume resistivity $\Omega cm$ |
| 1 | 96.95 | 1 | 0.05 | 2 | 1700 | 5 | — | — | 99.1 | $1 \times 10^{15}$ |
| 2 | 94.95 | 3 | 0.05 | 2 | 1720 | 5 | — | — | 99.1 | $2 \times 10^{15}$ |
| 3 | 93.8 | 5 | 0.2 | 1 | 1750 | 3 | — | — | 99.5 | $1 \times 10^{15}$ |
| 4 | 88.95 | 9 | 2 | 0.05 | 1850 | 3 | — | — | 99.5 | $4 \times 10^{15}$ |
| 5 | 94.95 | 3 | 0.05 | 2 | 1720 | 3 | 1400 | 5 | 99.4 | $1 \times 10^{15}$ |
| 6 | 88.95 | 9 | 2 | 0.05 | 1850 | 3 | 1450 | 2 | 100 | $5 \times 10^{15}$ |
| 7 | 93.8 | 5 | 0.2 | 1 | 1750 | 3 | 1500 | 3 | 100 | $1 \times 10^{15}$ |
| 8 | 94.95 | 3 | 0.05 | 2 | 1720 | 5 | 1650 | 5 | 100 | $2 \times 10^{15}$ |

Examples 1 to 8 were obtained by mixing the predetermined amounts of yttrium oxide, titanium oxide and magnesium oxide with aluminum nitride, sintering the mixed and cooling the sintered, or sintering the mixed and cooling the sintered with annealing the sintered during the cooling.

As shown in the table 1, the AlN sintered bodies of the examples showed the relative densities of 99% or more and the volume resistivities of $1 \times 10^{15}$ $\Omega cm$ or more.

FIG. 1 is a graph showing a variation of volume resistivity according to a variation of electric field applied to the aluminum nitride (AlN) sintered body in the first and second examples of the present invention. As shown in FIG. 1, the AlN sintered body of the examples showed stable volume resistivities ($\rho$) in case that the intensity of applied voltage (E) increased.

Figure 2:
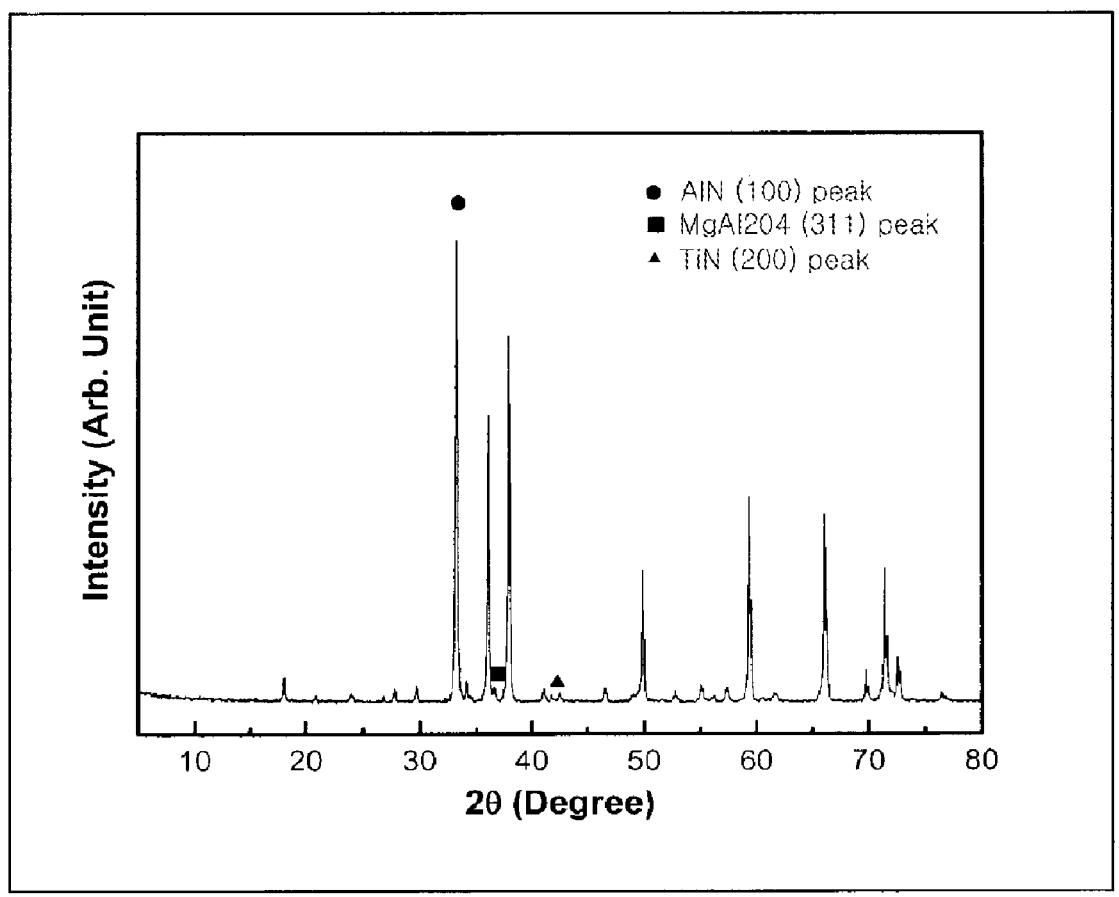
FIG. 2 is a graph showing an X-ray diffraction analysis result of an aluminum nitride (AlN) sintered body in the seventh example of the present invention.

Meanwhile a crystalline phase was checked using X-ray diffraction (XRD) analysis. FIG. 2 is a graph showing a result of XRD of the AlN sintered body in the example 7. As shown in FIG. 2, the sintered body of the example contained yttrium aluminate, titanium nitride and magnesium aluminate, which is spinet, as well as AlN as a main crystalline phase, wherein a ratio of diffraction peak intensity of TiN(200) peak to that of AlN(100) peak was within 0.1 to 20% and a ratio of diffraction peak intensity of $MgAl_2O_4$(311) peak to that of AlN(100) peak was within 0.1 to 10%.

COMPARATIVE EXAMPLES

Table 2 shows source materials, sintering conditions and sintered body characteristics of the comparative examples.

The comparative examples 1 to 7 were different from the examples in the amounts of yttrium oxide, titanium oxide and magnesium oxide to be mixed with the aluminum nitride and in the sintering condition.

As a result, as shown in FIG. 2, the AlN sintered body of the comparative examples showed the volume resistivities below $1 \times 10^{15}$ $\Omega cm$ or the relative densities below 99%. In case of such AlN sintered body with the volume resistivity below $1 \times 10^{15}$ $\Omega cm$ or the relative density below 99%, it is not proper to be applied to the coulomb electrostatic chucks.

Meanwhile, although the comparative example 2 showed the relative density of 99% due to an influence of yttrium oxide (5 wt %), it also showed the volume resistivity of $5 \times 10^{14}$ $\Omega cm$ due to the influences of titanium oxide and magnesium oxide (respectively 0 wt %) and low sintering temperature (1650° C.).

As described above, the AlN sintered body according to the present invention has good leakage current characteristic, enough adsorbing property, good detachment property and excellent thermal conductivity so that it can be applied to even a member for manufacturing semiconductor requiring high volume resistivity like the coulomb type electrostatic chucks.

What is claimed is:

1. A method for preparing a high dense aluminum nitride (AlN) sintered body, comprising the steps of:
preparing powders for the AlN sintered body comprising $Y_2O_3$ of 0.1 to 15 wt %, $TiO_2$ of 0.01 to 5 wt % and MgO of 0.1 to 10 wt % (S1); and
obtaining the AlN sintered body with a volume resistivity of $1 \times 10^{15}$ $\Omega cm$ or more at a normal temperature and a relative density of 99% or more by sintering the powders and then cooling the sintered powders or sintering the

TABLE 2

| Comparative Examples | Source material condition | | | | Sintering condition | | | | Sintered body characteristic | |
|---|---|---|---|---|---|---|---|---|---|---|
| | AlN wt % | $Y_2O_3$ wt % | $TiO_2$ wt % | MgO wt % | Sintering temp. °C. | Sintering time Hour | Annealing temp. °C. | Annealing time Hour | Relative density % | Volume resistivity $\Omega cm$ |
| 1 | 91 | 9 | 0 | 0 | 1750 | 3 | — | — | 99.7 | $1 \times 10^{14}$ |
| 2 | 95 | 5 | 0 | 0 | 1650 | 6 | — | — | 99 | $5 \times 10^{14}$ |
| 3 | 99.6 | 0 | 0.4 | 0 | 1680 | 5 | — | — | 97.8 | $2 \times 10^{15}$ |
| 4 | 91 | 9 | 0 | 0 | 1750 | 3 | 1500 | 3 | 99.9 | $1 \times 10^{14}$ |
| 5 | 98 | 0 | 2 | 0 | 1680 | 5 | 1450 | 5 | 98.3 | $3 \times 10^{15}$ |
| 6 | 99.6 | 0 | 0.4 | 0 | 1720 | 1 | 1450 | 1 | 97.6 | $8 \times 10^{14}$ |
| 7 | 99.5 | 0 | 0 | 0.5 | 1800 | 3 | — | — | 100 | $4 \times 10^{13}$ | powders and then cooling the sintered powders with annealing the sintered powders during the cooling (S2).

2. The method according to claim 1, wherein in the step S2, the sintering temperature is 1700 to 1850° C.

3. The method according to claim 2, wherein the sintering time is 1 to 10 hours.

4. The method according to claim 1, wherein in the step S2, the annealing temperature is 1400 to 1650° C.

5. The method according to claim 4, wherein the annealing time is 1 to 5 hours.

* * * * *